United States Patent
Yang et al.

(10) Patent No.: US 10,297,786 B2
(45) Date of Patent: May 21, 2019

(54) ORGANIC LIGHT-EMITTING DIODE DISPLAY PANEL, METHOD FOR MANUFACTURING THE SAME AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Yiming Zhao, Beijing (CN); Xiao Sun, Beijing (CN); Bing Bai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 405 days.

(21) Appl. No.: 14/387,774

(22) PCT Filed: Dec. 17, 2013

(86) PCT No.: PCT/CN2013/089688
§ 371 (c)(1),
(2) Date: Sep. 24, 2014

(87) PCT Pub. No.: WO2015/018163
PCT Pub. Date: Feb. 12, 2015

(65) Prior Publication Data
US 2016/0254480 A1 Sep. 1, 2016

(30) Foreign Application Priority Data
Aug. 7, 2013 (CN) .......................... 2013 1 0341985

(51) Int. Cl.
*H01L 51/54* (2006.01)
*H01L 51/56* (2006.01)
(Continued)

(52) U.S. Cl.
CPC ...... *H01L 51/5246* (2013.01); *H01L 51/0034* (2013.01); *H01L 51/0035* (2013.01);
(Continued)

(58) Field of Classification Search
CPC ........................ H01L 51/5259; H01L 51/5246
(Continued)

(56) References Cited

U.S. PATENT DOCUMENTS

| 4,226,063 A * | 10/1980 | Chenel .................... E06B 3/677 52/172 |
| 2007/0171637 A1 * | 7/2007 | Choi .................... H01L 51/5246 362/227 |

(Continued)

FOREIGN PATENT DOCUMENTS

| CN | 1909263 A | 2/2007 |
| CN | 101097873 A | 1/2008 |

(Continued)

OTHER PUBLICATIONS

Third Office Action regarding Chinese application No. 201310341985.X, dated Oct. 30, 2015. Translation provided by Dragon Intellectual Property Law Firm.
(Continued)

*Primary Examiner* — Christopher M Raabe
(74) *Attorney, Agent, or Firm* — Harness, Dickey & Pierce, P.L.C.

(57) ABSTRACT

The present disclosure provides an OLED display panel including a display substrate having a displaying region and a surrounding region, a package substrate covering the display substrate, and a UV-cured encapsulant composition
(Continued)

located at the surrounding region of the display substrate so as to seal a gap between the display substrate and the package substrate. An organic light-emitting element is formed at the displaying region of the display substrate. The UV-cured encapsulant composition contains in weight percentage 1% to 90% of inorganic nano particles.

17 Claims, 1 Drawing Sheet

(51) Int. Cl.
      *H01L 51/52*       (2006.01)
      *H01L 51/00*       (2006.01)
      *H01L 27/32*       (2006.01)

(52) U.S. Cl.
    CPC .......... *H01L 51/5259* (2013.01); *H01L 51/56* (2013.01); *H01L 27/3246* (2013.01); *H01L 27/3283* (2013.01); *H01L 2227/323* (2013.01); *H01L 2251/303* (2013.01); *H01L 2251/5369* (2013.01)

(58) Field of Classification Search
    USPC ..... 313/498–512; 315/169.3; 345/36, 45, 76
    See application file for complete search history.

(56) References Cited

U.S. PATENT DOCUMENTS

| | | | | |
|---|---|---|---|---|
| 2008/0138531 A1* | 6/2008 | Laginess | ................. | C09D 4/00 427/508 |
| 2009/0026934 A1* | 1/2009 | Fujita | ....................... | C09J 7/021 313/504 |
| 2009/0128016 A1* | 5/2009 | Gomi | ..................... | H05B 33/04 313/504 |
| 2010/0089636 A1* | 4/2010 | Ramadas | ............... | B82Y 15/00 174/521 |
| 2011/0072961 A1* | 3/2011 | Jungkuist | .............. | E06B 3/6621 89/36.02 |
| 2011/0132449 A1* | 6/2011 | Ramadas | ............... | H05B 33/04 136/256 |
| 2012/0169229 A1* | 7/2012 | You | ..................... | H01L 27/3244 315/51 |
| 2014/0252342 A1* | 9/2014 | Ramadas | ................ | H01L 21/56 257/40 |
| 2014/0307407 A1* | 10/2014 | Han | ...................... | G02F 1/1339 361/784 |
| 2015/0123092 A1* | 5/2015 | Kikuchi | ............. | H01L 51/5246 257/40 |

FOREIGN PATENT DOCUMENTS

| | | |
|---|---|---|
| CN | 101812278 A | 8/2010 |
| CN | 101993513 A | 3/2011 |
| CN | 102061127 A | 5/2011 |
| CN | 102544056 A | 7/2012 |
| CN | 103109234 A | 5/2013 |
| CN | 103214888 A | 7/2013 |
| CN | 103440824 A | 12/2013 |
| JP | 2010245365 A | 1/2010 |
| JP | 2012109508 A | 6/2012 |
| WO | 2011027658 A1 | 3/2011 |

OTHER PUBLICATIONS

International Search Report and Written Opinion dated May 14, 2014 regarding PCT/CN2013/089688. Translation provided by Dragon Intellectual Property Law Firm.

Chinese Office Action dated Jan. 14, 2015 regarding Application No. 201310341985.X, filed Aug. 7, 2013. Translation provided by Dragon Intellectual Property Law Firm.

* cited by examiner

ORGANIC LIGHT-EMITTING DIODE DISPLAY PANEL, METHOD FOR MANUFACTURING THE SAME AND DISPLAY DEVICE

CROSS-REFERENCE TO RELATED APPLICATION

This application is the U.S. national phase of PCT Application No. PCT/CN2013/089688 filed on Dec. 17, 2013, which claims priority to Chinese Patent Application No. 201310341985.X filed on Aug. 7, 2013, the disclosures of which are incorporated in their entirety by reference herein.

FIELD OF THE INVENTION

The present disclosure relates to the field of display technology, in particularly to an organic light-emitting diode display panel, a method for manufacturing the same and a display device.

DESCRIPTION OF THE PRIOR ART

Organic light-emitting diode (OLED) display panel, as a newly emerging flat panel display, has such advantages as active light emission, high contrast, being super-thin and rapid response, and thus is generally regarded as a main force of next-generation flat display devices. Its light-emitting principle is that, an organic light-emitting material is deposited between two electrodes and energized by direct current to generate excitons, and then the excitons are recombined so as to emit light. The service life of an OLED device depends, on one hand, on the selected organic light-emitting material and on the other hand, on the package mode of the device. It is required to strictly prevent ambient oxygen and moisture from entering an interior of the device and contacting sensitive organic substances and the electrodes. This is because the moisture or oxygen will easily result in degradation or invalidation of characteristics of the organic light-emitting device. Even trace amount of the moisture will also result in the separation of an organic light-emitting compound layer from an electrode layer, and black spots will occur. In order to inhibit the degradation and invalidation during a long-term operation of the OLED and to enable the OLED to operate for a sufficient period of time, there is a high requirement for the material of an encapsulant.

SUMMARY OF THE INVENTION

In view of this, embodiments of the present disclosure provide an OLED display panel, a method for manufacturing the same and a display device, so as to improve sealability of the OLED display panel.

One embodiment of the present disclosure provides an OLED display panel, including a display substrate having a displaying region and a surrounding region, and a package substrate covering the display substrate, an organic light-emitting element being formed at the displaying region of the display substrate. The OLED display panel further includes:

a UV-cured encapsulant composition located at the surrounding region of the display substrate so as to seal a gap between the display substrate and the package substrate.

The UV-cured encapsulant composition contains in weight percentage 1% to 90% of inorganic nano particles.

In the OLED display panel according to one embodiment of the present disclosure, the UV-cured encapsulant composition for sealing the gap between the display substrate and the package substrate contains the inorganic nano particles, which can not only improve the strength of sealant but also can absorb water and oxygen. This may effectively improve the sealability of the OLED display panel and prolong the service life thereof.

Specifically, in the OLED display panel according to one embodiment of the present disclosure, the UV-cured encapsulant composition contains in weight percentage 5% to 75% of an ethylenically unsaturated monomer, 10% to 40% of a solvent and 0.2% to 5% of an additive.

Optionally, in order to further improve the sealability of the OLED display panel, in the OLED display panel according to one embodiment of the present disclosure, the UV-cured encapsulant composition includes a sealant composition and a desiccant composition. The desiccant composition is located between the sealant composition and the organic light-emitting element.

The sealant composition contains in weight percentage 1% to 15% of inorganic nano particles;

the desiccant composition contains in weight percentage 15% to 90% of inorganic nano particles.

Specifically, the sealant composition contains in weight percentage 10% to 40% of a solvent, 0.1% to 2.5% of a photoinitiator, 0.2% to 5% of an additive and 5% to 75% of an ethylenically unsaturated monomer.

The desiccant composition contains in weight percentage 10% to 20% of a solvent, 0.1% to 2.5% of a photoinitiator, 0.2% to 5% of an additive and 5% to 75% of an ethylenically unsaturated monomer.

Specifically, the inorganic nano particles are one of titanium oxide, barium sulfate, magnesium oxide, zinc oxide, silicon dioxide, zirconium oxide, barium oxide, aluminium oxide, yttrium oxide, silicon nitride, silicon carbide, boron oxide, calcium oxide, nitride ceramics and carbide ceramics, or a combination thereof.

Specifically, the ethylenically unsaturated monomer is one of aliphatic polyurethane acrylate, polyether acrylate, acrylate, hydroxyl group-containing polyester acrylate, maleimide, phthalimide, 2-hydroxy-4-phthalimide, a hydroxyl group-containing acid, a hydroxyl group-containing anhydride, and an epoxy resin containing a plurality of benzyl epoxy groups in a main chain, or a combination thereof.

Specifically, the photoinitiator is one of a free radical-type photoinitiator and a cationic-type photoinitiator, or a combination thereof.

Specifically, the additive is one of an adhesion promoter, a defoamer and a wetting/leveling agent, or a combination thereof.

Specifically, the solvent is one of ketones, esters, ethers, aliphatic hydrocarbons, cycloalkane compounds and aromatic hydrocarbon solvents, or a combination thereof.

Optionally, in order to prevent the pollution of the UV-cured encapsulant composition to the organic light-emitting element, the OLED display panel according to one embodiment of the present disclosure further includes an encapsulation isolation fame located between the organic light-emitting element and the UV-cured encapsulant composition.

Accordingly, one embodiment of the present disclosure further provides a method for manufacturing an OLED display panel, including the steps of:

forming an organic light-emitting element at a displaying region of a displaying substrate;

coating a UV-cured encapsulant composition onto a surrounding region of the display substrate, the UV-cured encapsulant composition containing in weight percentage 1% to 90% of inorganic nano particles;

covering the display substrate with a package substrate; and curing the UV-cured encapsulant composition with UV light so as to seal a gap between the display substrate and the package substrate.

Optionally, in order to prevent the pollution of the UV-cured encapsulant composition to the organic light-emitting element, before coating a UV-cured encapsulant composition onto a surrounding region of the display substrate, the method further includes forming an encapsulation isolation frame at the surrounding region of the display substrate, the encapsulation isolation frame being arranged between the displaying region and a region where the UV-cured encapsulant composition is coated.

Specifically, before forming an organic light-emitting element at a displaying region of a display substrate, the method further includes forming a pixel partition wall at the displaying region of the display substrate.

The step of forming an encapsulation isolation frame at the surrounding region of the display substrate includes forming the encapsulation isolation frame while forming the pixel partition wall.

Specifically, the UV-cured encapsulant composition contains in weight percentage 5% to 75% of an ethylenically unsaturated monomer, 10% to 40% of a solvent and 0.2% to 5% of an additive.

Optionally, in order to further improve the sealability of the OLED display panel, the UV-cured encapsulant composition includes a sealant composition and a desiccant composition. The desiccant composition is located between the sealant composition and the organic light-emitting element.

The sealant composition contains in weight percentage 1% to 15% of inorganic nano particles;

and the desiccant composition contains in weight percentage 15% to 90% of inorganic nano particles.

Specifically, the sealant composition contains in weight percentage 10% to 40% of a solvent, 0.1% to 2.5% of a photoinitiator, 0.2% to 5% of an additive and 5% to 75% of an ethylenically unsaturated monomer.

The desiccant composition contains in weight percentage 10% to 20% of a solvent, 0.1% to 2.5% of a photoinitiator, 0.2% to 5% of an additive and 5% to 75% of an ethylenically unsaturated monomer.

Specifically, the inorganic nano particle are one of titanium oxide, barium sulfate, magnesium oxide, zinc oxide, silicon dioxide, zirconium oxide, barium oxide, aluminium oxide, yttrium oxide, silicon nitride, silicon carbide, boron oxide, calcium oxide, nitride ceramics and carbide ceramics, or a combination thereof.

Specifically, the ethylenically unsaturated monomer is one of aliphatic polyurethane acrylate, polyether acrylate, acrylate, hydroxyl group-containing polyester acrylate, maleimide, phthalimide, 2-hydroxy-4-phthalimide, a hydroxyl group-containing acid, a hydroxyl group-containing anhydride, and an epoxy resin containing a plurality of benzyl epoxy groups in a main chain, or a combination thereof.

Specifically, the photoinitiator is one of a free radical-type photoinitiator and a cationic-type photoinitiator, or a combination thereof.

Specifically, the additive is one of an adhesion promoter, a defoamer and a wetting/leveling agent, or a combination thereof.

Specifically, the solvent is one of ketones, esters, ethers, aliphatic hydrocarbons, cycloalkane compounds and aromatic hydrocarbon solvents, or a combination thereof.

Accordingly, one embodiment of the present disclosure further provides an OLED display device including the above-mentioned OLED display panel.

DETAILED DESCRIPTION OF THE PREFERRED EMBODIMENTS

Figure 1:
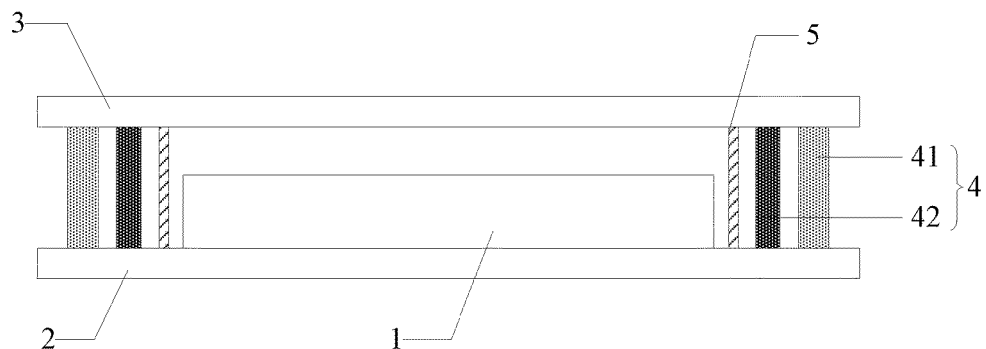
FIG. 1 is a schematic view showing an OLED display panel according to one embodiment of the present disclosure.

Implementation of an organic light-emitting diode (OLED) display panel, a method for manufacturing the same and a display device according to embodiments of the present disclosure will be described hereinafter in conjunction with the drawings.

Shapes and sizes of components in the drawings are merely for illustrative purposes, but shall not be used to reflect actual proportions of a display panel.

As shown in FIG. 1, an OLED display panel according to one embodiment of the present disclosure includes a display having a displaying region and a surrounding region, and a package substrate 3 covering the display substrate 2. An organic light-emitting element 1 is formed at the displaying region of the display substrate 2. The OLED display panel further includes a UV-cured encapsulant composition 4 located at the surrounding region of the display substrate 2 so as to seal a gap between the display substrate 2 and the package substrate 3.

The UV-cured encapsulant composition 4 contains in weight percentage, 1% to 90% of inorganic nano particles.

Specifically, the inorganic nano particles generally have a particle size of less than 50 nm.

In the OLED display panel according to one embodiment of the present disclosure, the UV-cured encapsulant composition 4 for sealing the gap between the display substrate 2 and the package substrate 3 contains the inorganic nano particles, which can not only improve the strength of sealant but also can absorb water and oxygen. As a result, it is able to effectively improve the sealability of the OLED display panel and prolong the service life thereof.

Further, as shown in FIG. 1, the OLED display panel according to one embodiment of the present disclosure further includes an encapsulation isolation frame 5 located between the organic light-emitting element 1 and the UV-cured encapsulant composition 4.

The encapsulation isolation frame 5 is located outside an edge of the organic light-emitting element 1 and keeps the UV-cured encapsulant composition 4 outside the encapsulation isolation frame 5. This may effectively prevent the UV-cured encapsulant composition 4 from contacting the organic light-emitting element 1, thereby preventing the pollution of the UV-cured encapsulant composition 4 to the organic light-emitting element 1.

During the implementation, the encapsulation isolation frame 5 may be formed on the display substrate 2 together with a pixel partition wall (bank, not shown). Specifically, the pixel partition wall (bank) is generally formed at the displaying region of the display substrate 2, so as to separate the organic light-emitting element 1 into a plurality of pixels, thereby preventing color mixture of pixels with different colors when the organic light-emitting element 1 is manufactured by an evaporation or printing process. It should be appreciated that, the organic light-emitting element 1 shown in FIG. 1 is formed integrally, and it is not used to limit the structure and the shape thereof. In actual application, the organic light-emitting element 1 may be separated by the pixel partition wall into a plurality of pixels, and organic light-emitting layers corresponding to different colors may be formed at regions corresponding to different pixels by the evaporation or printing process.

Specifically, in the OLED display panel according to one embodiment of the present disclosure, the UV-cured encapsulant composition 4 contains in weight percentage 5% to 75% of an ethylenically unsaturated monomer, 10% to 40 w% of a solvent and 0.2% to 5% of an additive. The ethylenically unsaturated monomers is polymerized to generate a polymer after being radiated by UV light, so as to seal the gap between the display substrate 2 and the package substrate 3.

During the implementation, as shown in FIG. 1, the UV-cured encapsulant composition 4 located at the surrounding region of the display substrate 2 may be a two-layer structure including a sealant composition 41 and a desiccant composition 42. The desiccant composition 42 is located between the sealant composition 41 and the organic light-emitting element 1.

The sealant composition 41 contains in weight percentage 1% to 15%, preferably 1% to 10%, more preferably 1% to 5%, of inorganic nano particles.

The desiccant composition 42 contains in weight percentage 15% to 90%, preferably 30% to 90%, more preferably 45% to 85%, of inorganic nano particles.

Specifically, more inorganic nano particles are provided in the desiccant composition 42 at an inner side than in the sealant composition 41 at an outer side. The desiccant composition 42 may further absorb vapor and oxygen entering an interior of the display panel through the sealant composition 41, and thereby prolonging the service life of the OLED display panel.

Specifically, the sealant composition 4 may contain in weight percentage 10% to 40% of a solvent, 0.1% to 2.5% of a photoinitiator, 0.2% to 5% of an additive, and 5% to 75%, preferably 5% to 65%, and more preferably 10% to 60%, of an ethylenically unsaturated monomer.

The desiccant composition 42 may contain in weight percentage 10% to 20% of a solvent, 0.1% to 2.5% of a photoinitiator, 0.2% to 5% of an additive, and 5% to 75%, preferably 5% to 65%, and more preferably 10% to 60%, of an ethylenically unsaturated monomer.

During the implementation, the inorganic nano particles may be one of titanium oxide, barium sulfate, magnesium oxide, zinc oxide, silicon dioxide, zirconium oxide, barium oxide, aluminium oxide, yttrium oxide, silicon nitride, silicon carbide, boron oxide, calcium oxide, nitride ceramics and carbide ceramics, or a combination thereof.

During the implementation, the ethylenically unsaturated monomer is one of aliphatic polyurethane acrylate, polyether acrylate, acrylate, hydroxyl group-containing polyester acrylate, maleimide, phthalimide, 2-hydroxy-4-phthalimide, a hydroxyl group-containing acid, a hydroxyl group-containing anhydride, and an epoxy resin containing a plurality of benzyl epoxy groups in a main chain, or a combination thereof.

During the implementation, the photoinitiator may be one of a free radical-type photoinitiator and a cationic-type photoinitiator, or a combination thereof.

During the implementation, the additive may be one of an adhesion promoter, a defoamer and a wetting/leveling agent, or a combination thereof.

During the implementation, the solvent may be one of ketones, esters, ethers, aliphatic hydrocarbons, cycloalkane compounds and aromatic hydrocarbon solvents, or a combination thereof.

The performance of the OLED display panel according to one embodiment of the present disclosure will be described in details hereinafter with examples.

EXAMPLES

Table 1 shows results of UV-cured encapsulant compositions containing components in Example 1 to Example 10 when being used for encapsulating the OLED display panel.

TABLE 1

| Components (weight percentage) % | | Examples | | | | | | | | | |
|---|---|---|---|---|---|---|---|---|---|---|---|
| | | 1 | 2 | 3 | 4 | 5 | 6 | 7 | 8 | 9 | 10 |
| Inorganic nano particles | Silicon dioxide | 0 | 10 | 10 | 18 | 5.5 | 14 | 20 | 3 | 10 | 40 |
| | Aluminium oxide | 5 | 5 | 14 | 20 | 14 | 14 | 20 | 30 | 22 | 0 |
| Ethylenically unsaturated monomer | DPHA | 35 | 30 | 32.5 | 36.8 | 33 | 41 | 34 | 25 | 45 | 33 |
| | Epoxy resin | 40 | 33.5 | 30 | 3.4 | 30 | 11 | 6 | 22 | 8 | 0 |
| Photoinitiator | Irgacure 379 | 0.8 | 0.8 | 0.7 | 1 | 1.2 | 1.7 | 1 | 1.2 | 2 | 2 |
| Solvent | PMA | 18.5 | 20 | 12 | 20 | 15 | 16 | 16 | 15.3 | 10.5 | 20 |
| Additive | Defoamer | 0.5 | 0.5 | 0.5 | 0.3 | 0.8 | 1.5 | 1.5 | 2 | 2 | 3 |
| | Adhesion promoter | 0.2 | 0.2 | 0.3 | 0.5 | 0.5 | 0.8 | 1.5 | 1.5 | 0.5 | 2 |
| Results | Sealability | ○ | Δ | ○ | X | Δ | ○ | X | Δ | ○ | X |
| | Strength | X | X | Δ | Δ | Δ | ○ | Δ | ○ | ○ | Δ |

Specific Evaluation and Results

The sealability and strength of the UV-cured encapsulant compositions in the above examples will be evaluated as follows.

The sealability of the UV-cured encapsulant compositions will be evaluated at first. OLED display panels sealed with the UV-cured encapsulant compositions are tested at a temperature of 85° C. and a relative humidity of 85% for 7000 hours, and then air permeability and luminescence performance of the OLED display panels are compared. A symbol "○" represents well sealability, a symbol "Δ" represents general sealability, and a symbol "x" represents bad sealability. Table 1 shows the results.

Then, the strength of the UV-cured encapsulant compositions will be evaluated. Shear strength of the OLED display panels sealed with the UV-cured encapsulant compositions is measured using a strength tester. A symbol "○" represents well high strength, a symbol "Δ" represents general strength, and a symbol "x" represents low strength. Table 1 shows the results.

As shown in Table 1, the UV-cured encapsulant compositions in the OLED display devices have excellent sealability and strength. This may effectively improve the sealability of the OLED display device and prolong the service life thereof.

Based on the same inventive concept, one embodiment of the present disclosure further provides a method for manufacturing OLED display panels. The principle for solving the technical problem is similar to that of the aforementioned OLED display panel, so the implementation of the method may refer to that of the display panel, which will not be repeated herein.

Figure 2:
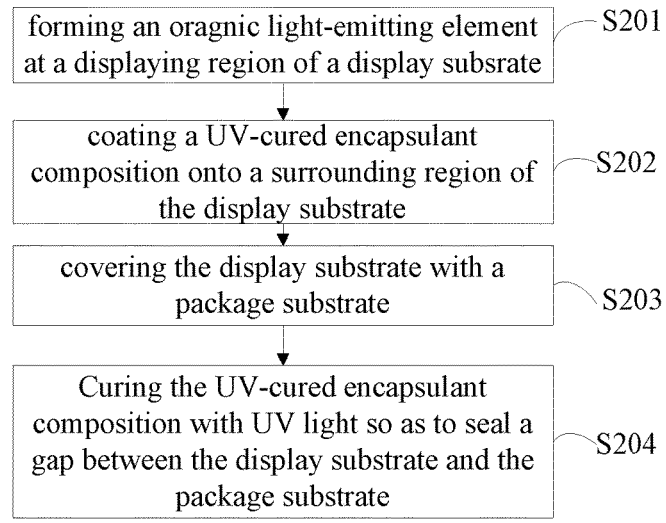
FIG. 2 is a flow chart of a method for manufacturing an OLED display panel according to one embodiment of the present disclosure.

As shown in FIG. 2, the method for manufacturing OLED display panels according to one embodiment of the present disclosure includes the steps of:

Step S201: forming an organic light-emitting element at a displaying region of a display substrate;

Step S202: coating a UV-cured encapsulant composition onto a surrounding region of the display substrate; the UV-cured encapsulant composition containing in weight percentage 1% to 90% of inorganic nano particles; specifically, the coating a UV-cured encapsulant composition may be implemented by spin-coating, printing or ODF;

Step S203: covering the display substrate with a package substrate; and

Step S204: curing the UV-cured encapsulant composition with UV light so as to seal a gap between the display substrate and the package substrate.

Further, before performing the step S202 of coating a UV-cured encapsulant composition onto a surrounding region of the display substrate, the method further includes following steps:

forming an encapsulation isolation frame at the surrounding region of the display substrate, the encapsulation isolation frame being arranged between the displaying region and a region where the UV-cured encapsulant composition is coated. The encapsulation isolation frame may effectively prevent the UV-cured encapsulant composition to be coated from contacting the organic light-emitting element, thereby preventing the pollution of the UV-cured encapsulant composition to the organic light-emitting element.

Specifically, before performing the step S201 of forming an organic light-emitting element at a displaying region of a display substrate, the method further includes forming a pixel partition wall (bank) at the displaying region of the display substrate.

The forming an encapsulation isolation frame at the surrounding region of the display substrate may specifically include forming the encapsulation isolation frame while forming the pixel partition wall.

Specifically, the pixel partition wall (bank) is generally formed at the displaying region of the display substrate, so as to separate the organic light-emitting element into a plurality of pixels, thereby preventing color mixture of pixels with different colors when the organic light-emitting element is manufactured by an evaporation or printing process.

Specifically, the UV-cured encapsulant composition may contain in weight percentage 5% to 75% of an ethylenically unsaturated monomer, 10% to 40% of a solvent and 0.2% to 5% of an additive. The ethylenically unsaturated monomer is polymerized to generate a polymer after being radiated by UV light, so as to seal the gap between the display substrate and the package substrate.

During the implementation, the UV-cured encapsulant composition may be a two-layer structure including a sealant composition and a desiccant composition. The desiccant composition is located between the sealant composition and the organic light-emitting element.

The sealant composition contains in weight percentage 1% to 15%, preferably 1% to 10%, more preferably 1% to 5%, of inorganic nano particles.

The desiccant composition contains in weight percentage 15% to 90%, preferably 30% to 90%, more preferably 45% to 85%, of inorganic nano particles.

Specifically, more inorganic nano particles are provided in the desiccant composition at an inner side than in the sealant composition at an outer side. The desiccant composition may further absorb vapor and oxygen entering an interior of the display panel through the sealant composition, and thereby prolonging the service life of the OLED display panel.

Specifically, the sealant composition may contain in weight percentage 10% to 40% of a solvent, 0.1% to 2.5% of a photoinitiator, 0.2% to 5% of an additive, and 5% to 75%, preferably 5% to 65%, and more preferably 10% to 60%, of an ethylenically unsaturated monomer.

The desiccant composition may contain in weight percentage 10% to 20% of a solvent, 0.1% to 2.5% of a photoinitiator, 0.2% to 5% of an additive, and 5% to 75%, preferably 5% to 65%, and more preferably 10% to 60%, of an ethylenically unsaturated monomer.

During the implementation, the inorganic nano particles are one of titanium oxide, barium sulfate, magnesium oxide, zinc oxide, silicon dioxide, zirconium oxide, barium oxide, aluminium oxide, yttrium oxide, silicon nitride, silicon carbide, boron oxide, calcium oxide, nitride ceramics and carbide ceramics, or a combination thereof.

During the implementation, the ethylenically unsaturated monomer is one of aliphatic polyurethane acrylate, polyether acrylate, acrylate, hydroxyl group-containing polyester acrylate, maleimide, phthalimide, 2-hydroxy-4-phthalimide, a hydroxyl group-containing acid, a hydroxyl group-containing anhydride, and an epoxy resin containing a plurality of benzyl epoxy groups in a main chain, or a combination thereof.

During the implementation, the photoinitiator may be one of a free radical-type photoinitiator and a cationic-type photoinitiator, or a combination thereof.

During the implementation, the additive may be one of an adhesion promoter, a defoamer and a wetting/leveling agent, or a combination thereof.

During the implementation, the solvent may be one of ketones, esters, ethers, aliphatic hydrocarbons, cycloalkane compounds and aromatic hydrocarbon solvents, or a combination thereof.

Based on the same inventive concept, one embodiment of the present disclosure further provides an OLED display device including the above-mentioned OLED display panel according to one embodiment of the present disclosure. The OLED display device may be any product or component having a display function, such as a mobile phone, a flat panel PC, a TV, a display, a laptop PC, a digital photo frame and a navigator. The implementation of the OLED display device may refer to that of the OLED display panel, which will not be repeated herein.

The OLED display panel according to one embodiment of the present disclosure includes the display substrate including the displaying region and the surrounding region, the package substrate covering the display substrate, and the UV-cured encapsulant composition located at the surrounding region of the display substrate so as to seal the gap between the display substrate and the package substrate. The organic light-emitting element is formed at the displaying region of the display substrate. The UV-cured encapsulant composition contains in weight percentage 1% to 90% of inorganic nano particles. The UV-cured encapsulant composition for sealing the gap between the display substrate and the package substrate contains the inorganic nano particles, which can not only improve the strength of sealant but also can absorb water and oxygen. This may effectively improve the sealability of the OLED display panel and prolong the service life thereof.

Obviously, a person skilled in the art may make modifications and improvements without departing from the spirit and scope of the present disclosure. If these modifications and improvements fall within the scope of the appended claims and the equivalents thereof, the present disclosure also intends to include these modifications and improvements.

What is claimed is:

1. An organic light-emitting diode (OLED) display panel, comprising a display substrate having a displaying region and a surrounding region, and a package substrate covering the display substrate, an organic light-emitting element being formed at the displaying region of the display substrate, the OLED display panel further comprising:
   a UV-cured encapsulant composition located at the surrounding region of the display substrate and not at the displaying region of the display substrate, so as to seal a gap between the display substrate and the package substrate, wherein the UV-cured encapsulant composition comprises a sealant composition and a desiccant composition, and the desiccant composition is located between the sealant composition and the organic light-emitting element and does not contact the organic light-emitting element or the sealant composition; and
   an encapsulation isolation frame located between the organic light-emitting element and the desiccant composition,
   wherein the encapsulation isolation frame does not contact the organic light-emitting element or the desiccant composition, and is formed of a material different from that of the sealant composition and that of the desiccant composition, and
   wherein the sealant composition contains in weight percentage 1% to 15% of inorganic nano particles, and
   the desiccant composition contains in weight percentage 15% to 90% of inorganic nano particles, and has a greater amount of the inorganic nano particles than the sealant composition.

2. The OLED display panel according to claim 1, wherein the UV-cured encapsulant composition contains in weight percentage 5% to 75% of an ethylenically unsaturated monomer, 10% to 40% of a solvent and 0.2% to 5% of an additive.

3. The OLED display panel according to claim 1, wherein the sealant composition contains in weight percentage 10% to 40% of a solvent, 0.1% to 2.5% of a photoinitiator, 0.2% to 5% of an additive and 5% to 75% of an ethylenically unsaturated monomer, and
   the desiccant composition contains in weight percentage 10% to 20% of a solvent, 0.1% to 2.5% of a photoinitiator, 0.2% to 5% of an additive and 5% to 75% of an ethylenically unsaturated monomer.

4. The OLED display panel according to claim 1, wherein the inorganic nano particles are one of titanium oxide, barium sulfate, magnesium oxide, zinc oxide, silicon dioxide, zirconium oxide, barium oxide, aluminum oxide, yttrium oxide, silicon nitride, silicon carbide, boron oxide, calcium oxide, nitride ceramics and carbide ceramics, or a combination thereof.

5. The OLED display panel according to claim 2, wherein the ethylenically unsaturated monomer is one of aliphatic polyurethane acrylate, polyether acrylate, acrylate, hydroxyl group-containing polyester acrylate, maleimide, phthalimide, 2-hydroxy-4-phthalimide, a hydroxyl group-containing acid, a hydroxyl group-containing anhydride, and an epoxy resin containing a plurality of benzyl epoxy groups in a main chain, or a combination thereof.

6. The OLED display panel according to claim 3, wherein the photoinitiator is one of a free radical-type photoinitiator and a cationic-type photoinitiator, or a combination thereof.

7. The OLED display panel according to claim 2, wherein the additive is one of an adhesion promoter, a defoamer and a wetting/leveling agent, or a combination thereof.

8. The OLED display panel according to claim 2, wherein the solvent is one of ketones, esters, ethers, aliphatic hydrocarbons, cycloalkane compounds and aromatic hydrocarbon solvents, or a combination thereof.

9. An organic light-emitting diode (OLED) display device, comprising an OLED display panel according to claim 1.

10. The organic light-emitting diode (OLED) display panel according to claim 1, wherein both the UV-cured encapsulant composition and the encapsulation isolation frame directly contact the display substrate, and a thickness of encapsulation isolation frame is less than that of the sealant composition and that of the desiccant composition.

11. A method for manufacturing an organic light-emitting diode (OLED) display panel, wherein the organic light-emitting diode (OLED) display panel comprises a display substrate having a displaying region and a surrounding region, and a package substrate covering the display substrate, an organic light-emitting element being formed at the displaying region of the display substrate, and further comprises a UV-cured encapsulant composition located at the surrounding region of the display substrate and not at the displaying region of the display substrate, so as to seal a gap between the display substrate and the package substrate, wherein the UV-cured encapsulant composition comprises a sealant composition and a desiccant composition, and the desiccant composition is located between the sealant composition and the organic light-emitting element and does not contact the organic light-emitting element or the sealant composition, and the organic light-emitting diode (OLED) display panel further comprises an encapsulation isolation frame located between the organic light-emitting element and the desiccant composition, wherein the encapsulation isolation frame does not contact the organic light-emitting element or the desiccant composition and is formed of a material different from that of sealant composition and that of the desiccant composition, the sealant composition contains in weight percentage 1% to 15% of inorganic nano particles, the desiccant composition contains in weight percentage 15% to 90% of inorganic nano particles, and the desiccant composition contains a greater amount of the inorganic nano particles than the sealant composition, wherein the method comprises:
forming the encapsulation isolation frame at the surrounding region of the display substrate;
forming the organic light-emitting element at the displaying region of the displaying substrate;
coating the UV-cured encapsulant composition onto the surrounding region of the display substrate;
covering the display substrate with the package substrate; and
curing the UV-cured encapsulant composition with UV light so as to seal a gap between the display substrate and the package substrate.

12. The method according to claim 11, wherein the UV-cured encapsulant composition contains in weight percentage 5% to 75% of an ethylenically unsaturated monomer, 10% to 40% of a solvent and 0.2% to 5% of an additive.

13. The method according to claim 11, wherein the sealant composition contains in weight percentage 10% to 40% of a solvent, 0.1% to 2.5% of a photoinitiator, 0.2% to 5% of an additive and 5% to 75% of an ethylenically unsaturated monomer, and the desiccant composition contains in weight percentage 10% to 20% of a solvent, 0.1% to 2.5% of a photoinitiator, 0.2% to 5% of an additive and 5% to 75% of an ethylenically unsaturated monomer.

14. The method according to claim 11, wherein the inorganic nano particles are one of titanium oxide, barium sulfate, magnesium oxide, zinc oxide, silicon dioxide, zirconium oxide, barium oxide, aluminum oxide, yttrium oxide, silicon nitride, silicon carbide, boron oxide, calcium oxide, nitride ceramics and carbide ceramics, or a combination thereof.

15. The method according to claim 12, wherein the ethylenically unsaturated monomer is one of aliphatic polyurethane acrylate, polyether acrylate, acrylate, hydroxyl group-containing polyester acrylate, maleimide, phthalimide, 2-hydroxy-4-phthalimide, a hydroxyl group-containing acid, a hydroxyl group-containing anhydride, and an epoxy resin containing a plurality of benzyl epoxy groups in a main chain, or a combination thereof.

16. The method according to claim 13, wherein the photoinitiator is one of a free radical-type photoinitiator and a cationic-type photoinitiator, or a combination thereof;

wherein the additive is one of an adhesion promoter, a defoamer and a wetting/leveling agent, or a combination thereof;
wherein the solvent is one of ketones, esters, ethers, aliphatic hydrocarbons, cycloalkane compounds and aromatic hydrocarbon solvents, or a combination thereof.

17. The method according to claim 11, wherein both the UV-cured encapsulant composition and the encapsulation isolation frame are formed to directly contact the display substrate, and a thickness of encapsulation isolation frame is formed to be less than that of the sealant composition and that of the desiccant composition.

* * * * *